(12) United States Patent
Lin et al.

(10) Patent No.: US 9,473,079 B2
(45) Date of Patent: Oct. 18, 2016

(54) POWER AMPLIFIER

(71) Applicant: National Chi Nan University, Puli, Nantou (TW)

(72) Inventors: Yo-Sheng Lin, Nantou (TW); Sin-Chen Lin, Nantou (TW); Tsung-Hua Li, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 0 days.

(21) Appl. No.: 14/624,841

(22) Filed: Feb. 18, 2015

(65) Prior Publication Data

US 2016/0056773 A1 Feb. 25, 2016

(30) Foreign Application Priority Data

Aug. 25, 2014 (TW) .............................. 103129194 A

(51) Int. Cl.
*H03F 1/56* (2006.01)
*H03F 3/60* (2006.01)

(52) U.S. Cl.
CPC ................ *H03F 1/56* (2013.01); *H03F 3/604* (2013.01); *H03F 2200/451* (2013.01)

(58) Field of Classification Search
CPC .................................................... H03F 1/0288
USPC ..................... 330/295, 124 R, 302
See application file for complete search history.

(56) References Cited

U.S. PATENT DOCUMENTS

| | | | | |
|---|---|---|---|---|
| 4,890,016 A * | 12/1989 | Tanaka | ............. | H03K 19/00392 326/121 |
| 5,834,975 A * | 11/1998 | Bartlett | .................... | H03F 3/211 330/278 |
| 6,069,525 A * | 5/2000 | Sevic | .................... | H03F 1/0244 330/124 R |
| 7,250,816 B2 * | 7/2007 | Smiley | .................. | H03F 1/0205 330/124 R |
| 7,408,404 B2 * | 8/2008 | Osman | .................. | H03F 1/0277 330/295 |
| 8,519,787 B2 * | 8/2013 | Murao | ................. | H04B 1/0483 330/124 R |
| 8,704,600 B2 * | 4/2014 | Sasaki | .................. | H03F 1/0277 330/302 |
| 8,872,583 B2 * | 10/2014 | Lee | ....................... | H03F 1/3241 330/149 |
| 8,890,620 B2 * | 11/2014 | Tamanoi | .................. | H03F 1/56 330/124 R |
| 8,994,450 B2 * | 3/2015 | Zhang | .................. | H03F 1/0288 330/124 R |
| 2005/0156671 A1 * | 7/2005 | Shanjani | ................. | H03F 1/483 330/295 |

* cited by examiner

*Primary Examiner* — Henry Choe
(74) *Attorney, Agent, or Firm* — Merchant & Gould P.C.

(57) ABSTRACT

A power amplifier includes a plurality of power amplification modules, each of which includes an input terminal and an output terminal. Equivalent input impedances seen respectively into the power amplification modules from the input terminals thereof are the same, and equivalent output impedances seen respectively into the power amplification modules from the output terminals thereof are the same. The input terminals of the power amplification modules are coupled together for receiving an input signal. The output terminals of the power amplification modules are coupled together for outputting an output signal. Each of the power amplification modules amplifies a portion of a power of the input signal to obtain a portion of a power of the output signal.

8 Claims, 3 Drawing Sheets

POWER AMPLIFIER

CROSS-REFERENCE TO RELATED APPLICATION

This application claims priority of Taiwanese Application No. 103129194, filed on Aug. 25, 2014.

FIELD OF THE INVENTION

The invention relates to an amplifier, and more particularly to a power amplifier.

BACKGROUND OF THE INVENTION

Referring to FIG. 1, a conventional radio frequency (RF) power amplifier includes a Wilkinson power divider 81, two power amplifier modules 82 and a Wilkinson power combiner 83.

The Wilkinson power divider 81 includes an input terminal 811 and two output terminals 812, 813. An equivalent impedance (Z91) seen into the Wilkinson power divider 81 from the input terminal 811 thereof is 50 ohms. Equivalent impedances (Z94, Z95) seen into the Wilkinson power divider 81 respectively from the output terminals 812, 813 thereof are both 50 ohms. The Wilkinson power divider 81 receives a radio frequency input signal with a power of P1 at the input terminal 811 thereof, divides the radio frequency input signal into two first radio frequency signals, each with a power of P2, and outputs the first radio frequency signals respectively at the output terminals 812, 813 thereof.

Each power amplifier module 82 is coupled to a respective output terminal 812, 813 of the Wilkinson power divider 81 for receiving a respective first radio frequency signal therefrom, and amplifies the power of the respective first radio frequency signal by a predetermined amplification factor to obtain a respective second radio frequency signal with a power of P3.

The Wilkinson power combiner 83 includes two input terminals 831, 832 coupled respectively to the power amplifier modules 82, and an output terminal 833. Equivalent input impedances (Z92, Z93) seen into the Wilkinson power combiner 83 respectively from the input terminals 831, 832 thereof are both 50 ohms. An equivalent output impedance (Z96) seen into the Wilkinson power combiner 83 from the output terminal 833 thereof is 50 ohms. The Wilkinson power combiner 83 receives the second radio frequency signals respectively from the power amplifier modules 82, combines the second radio frequency signals to obtain a radio frequency output signal with a power of P4, and outputs the radio frequency output signal at the output terminal 833 thereof.

The Wilkinson power divider 81 achieves a high degree of isolation between the output terminals 812, 813 thereof (i.e., a scattering parameter therebetween is zero) when the equivalent impedances seen into the Wilkinson power divider 81 respectively from the input and output terminals 811, 812, 813 thereof are matched. The Wilkinson power combiner 83 achieves a high degree of isolation between the input terminals 831, 832 thereof (i.e., a scattering parameter therebetween is zero) when the equivalent impedances seen into the Wilkinson power combiner 83 respectively from the input and output terminals 831, 832, 833 thereof are matched. In order to achieve impedance matching, the Wilkinson power divider 81 has to include a resistive element coupled between the output terminals 812, 813 thereof, and the Wilkinson power combiner 83 has to include a resistive element coupled between the input terminals 831, 832 thereof. With the inclusion of the resistive elements, the Wilkinson power divider 81 and the Wilkinson power combiner 83 are lossy (i.e., 2×P2<P1, and P4<2×P3), and a power gain of the conventional radio frequency power amplifier (i.e., a ratio of the power of the radio frequency output signal to the power of the radio frequency input signal) is decreased (i.e., smaller than the predetermined amplification factor). Therefore, the conventional radio frequency power amplifier cannot achieve both the high degree of isolation and the high power gain.

SUMMARY OF THE INVENTION

Therefore, an object of the present invention is to provide a power amplifier that can overcome the aforesaid drawback associated with the prior art.

According to this invention, a power amplifier is adapted for amplifying an input signal to generate an output signal. The power amplifier includes a number (N) of power amplification modules, each of which includes an input terminal and an output terminal, where N is a positive integer greater than one.

Equivalent input impedances seen respectively into the power amplification modules from the input terminals thereof are the same, and equivalent output impedances seen respectively into the power amplification modules from the output terminals thereof are the same.

The input terminals of the power amplification modules are coupled together for receiving the input signal. The output terminals of the power amplification modules are coupled together for outputting the output signal, and each of the power amplification modules amplifies a portion of a power of the input signal to obtain a portion of a power of the output signal.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE EMBODIMENT

Figure 1:
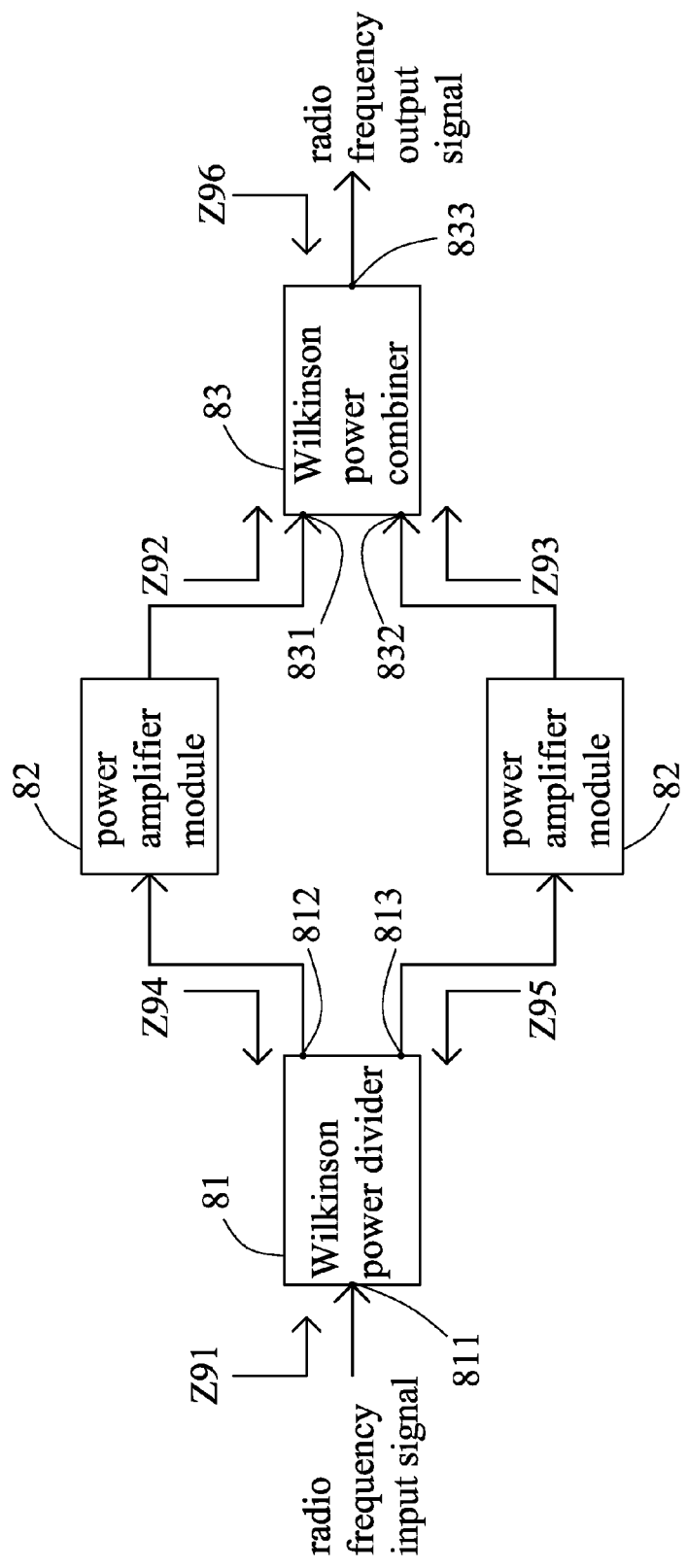
FIG. 1 is a block diagram illustrating a conventional radio frequency power amplifier.
Figure 2:
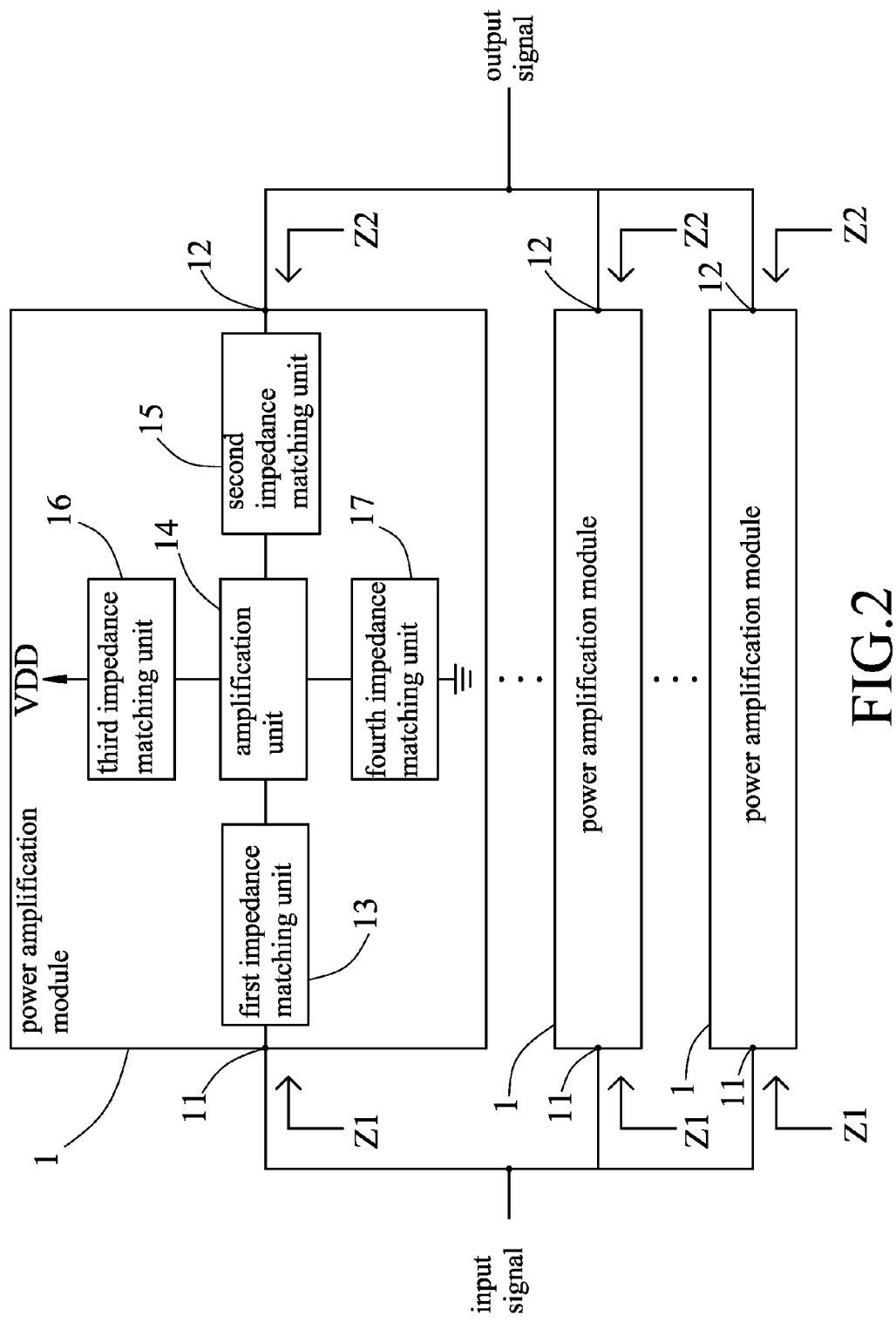
FIG. 2 is a block diagram illustrating an embodiment of a power amplifier according to this invention.

Referring to FIG. 2, an embodiment of a power amplifier according to this invention is adapted to be coupled to a signal source (not shown) and an end terminal circuit (not shown). The power amplifier receives an input signal from the signal source, amplifies the input signal to generate an output signal, and outputs the output signal to the end terminal circuit. In an example, the power amplifier may be used in a transceiver of a communication system, the signal source may be a mixer or another power amplifier of the transceiver, and the end terminal circuit may be an antenna of the transceiver. Moreover, each of the input and output signals may be a signal of radio or other frequency.

The power amplifier includes a number (N) of power amplification modules 1, each of which includes an input terminal 11 and an output terminal 12, where N is a positive integer greater than one. Equivalent input impedances (Z1) seen respectively into the power amplification modules 1 from the input terminals 11 are the same, and equivalent output impedances (Z2) seen respectively into the power amplification modules 1 from the output terminals 12 are the same. The input terminals 11 of the power amplification modules 1 are coupled together for receiving the input signal, the output terminals 12 of the power amplification modules 1 are coupled together for outputting the output signal, and each of the power amplification modules 1 amplifies a portion of a power of the input signal to obtain a portion of a power of the output signal.

In one embodiment, the equivalent input impedance (Z1) seen into each of the power amplification modules 1 from the input terminal 11 thereof is N times an equivalent output impedance seen into the signal source, and the equivalent output impedance (Z2) seen into each of the power amplification modules 1 from the output terminal 12 thereof is N times an equivalent input impedance seen into the end terminal circuit. In this embodiment, the equivalent output impedance seen into the signal source and the equivalent input impedance seen into the end terminal circuit are both, for example, 50 ohms (i.e., pure resistive), each equivalent input impedance (Z1) is, for example, N×50 ohms, and each equivalent output impedance (Z2) is, for example, N×50 ohms. It is noted that, in other embodiments, the equivalent output impedance seen into the signal source, the equivalent input impedance seen into the end terminal circuit, the equivalent input impedances (Z1) and the equivalent output impedances (Z2) may be complex.

In this embodiment, each of the power amplification modules 1 further includes a first impedance matching unit 13, a second impedance matching unit 15, a third impedance matching unit 16, a fourth impedance matching unit 17 and an amplification unit 14. The first impedance matching unit 13 is coupled to the input terminal 11. The second impedance matching unit 15 is coupled to the output terminal 12. The amplification unit 14 is coupled between the first and second impedance matching units 13, 15 for amplifying the portion of the power of the input signal to obtain the portion of the power of the output signal. The third impedance matching unit 16 is coupled between the amplification unit 14 and a power supply (not shown) that supplies a voltage (VDD). The fourth impedance matching unit 17 is coupled between ground and the amplification unit 14. The third and fourth impedance matching units 16, 17 cooperate with the first impedance matching unit 13 to determine the equivalent input impedance (Z1) seen into the power amplification module 1 from the input terminal 11. The third and fourth impedance matching units 16, 17 cooperate with the second impedance matching unit 15 to determine the equivalent output impedance (Z2) seen into the power amplification module 1 from the output terminal 12.

Figure 3:
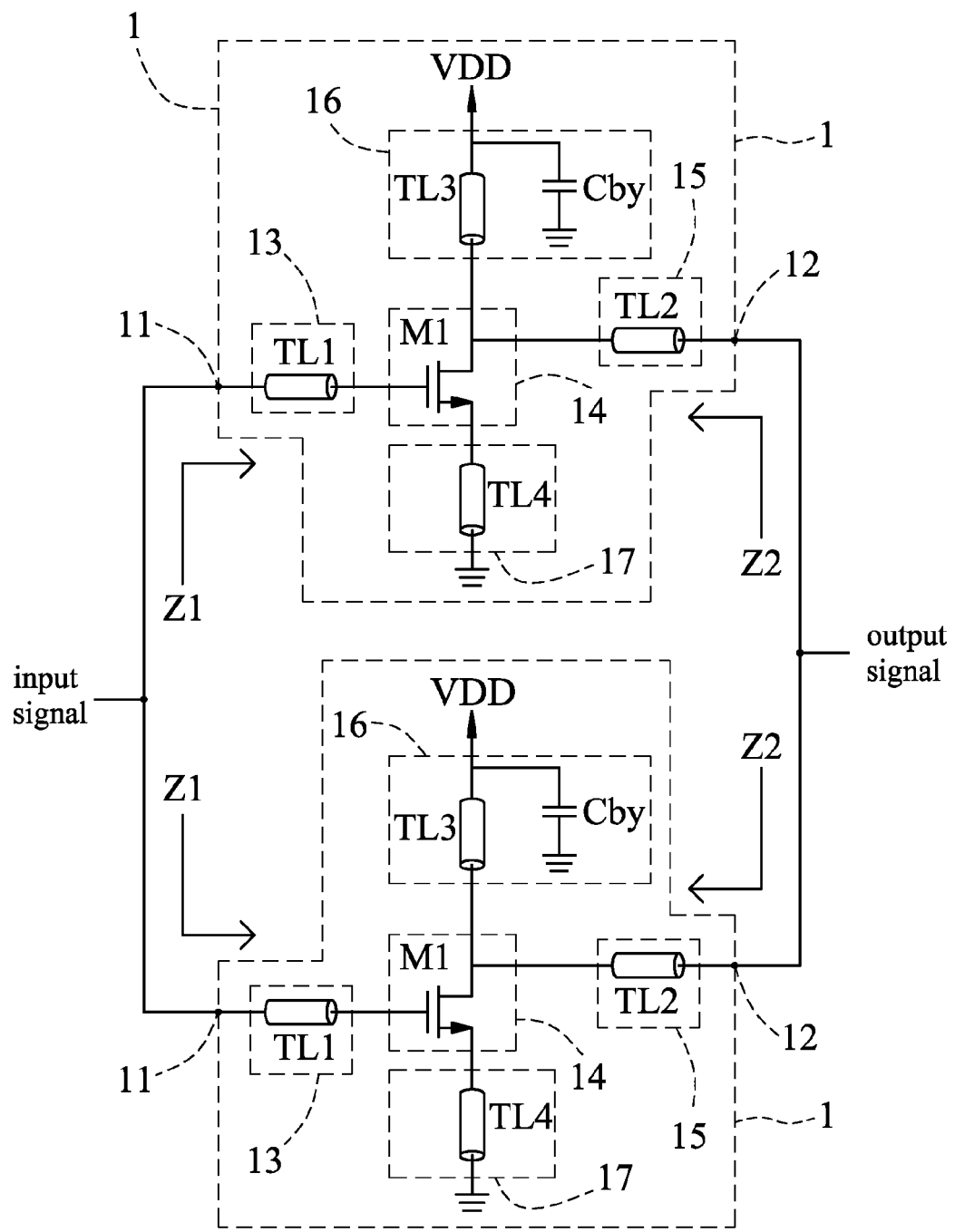
FIG. 3 is a schematic circuit diagram illustrating an example of the embodiment.

FIG. 3 illustrates an example of this embodiment in which N=2. In this example, the amplification unit 14 of each of the power amplification modules 1 includes a transistor (M1), e.g., an N-type metal oxide semiconductor field effect transistor. The transistor (M1) has a first terminal coupled to the second and third impedance matching units 15, 16, a second terminal coupled to the fourth impedance matching unit 17, and a control terminal coupled to the first impedance matching unit 13. Alternatively, the amplification unit 14 of each of the power amplification modules 1 may include multiple transistors (M1) that are, for example, cascoded or cascaded.

The first impedance matching unit 13 of each of the power amplification modules 1 includes a first transmission line (TL1) coupled between the input terminal 11 and the control terminal of the transistor (M1) of the amplification unit 14.

The second impedance matching unit 15 of each of the power amplification modules 1 includes a second transmission line (TL2) coupled between the output terminal 12 and the first terminal of the transistor (M1) of the amplification unit 14.

The third impedance matching unit 16 of each of the power amplification modules 1 includes a third transmission line (TL3) and a bypass capacitor (Cby). The third transmission line (TL3) is coupled between the power supply and the first terminal of the transistor (M1) of the amplification unit 14. The bypass capacitor (Cby) is coupled between ground and a common node between the third transmission line (TL3) and the power supply, and has a capacitance of, for example, 1.23 pF. Alternatively, the bypass capacitor (Cby) may be omitted.

The fourth impedance matching unit 17 of each of the power amplification modules 1 includes a fourth transmission line (TL4) coupled between ground and the second terminal of the transistor (M1) of the amplification unit 14.

The first to fourth transmission lines (TL1-TL4) of each power amplification module 1 are configured such that the equivalent input impedance (Z1) seen into the power amplification module 1 from the input terminal 11 is 2×50=100 ohms and such that the equivalent output impedance (Z2) seen into the power amplification module 1 from the output terminal 12 is 2×50=100 ohms. As a result, the equivalent input impedance seen into the power amplifier is 100//100=50 ohms, and matches the equivalent output impedance seen into the signal source, and the equivalent output impedance seen into the power amplifier is 100//100=50 ohms, and matches the equivalent input impedance seen into the end terminal circuit.

Since the equivalent input impedances (Z1) seen respectively into the power amplification modules 1 from the input terminals 11 thereof are the same, the amplification unit 14 of each power amplification module 1 receives half of the power of the input signal from the input terminal 11 through the first impedance matching unit 13, and amplifies the received power of the input signal to obtain half of the power of the output signal that is outputted to the output terminal 12 thereof through the second impedance matching unit 15. Then, the two halves of the power of the output signal outputted respectively by the power amplification modules 1 are summed at a common node between the output terminals 12 of the power amplification modules 1.

In view of the above, since the power amplification modules 1 are coupled in parallel and have the same equivalent input impedances (Z1) and the same equivalent output impedances (Z2) in this embodiment, no resistive element is required to be coupled between any two of the power amplification modules 1 to achieve impedance matching, thereby attaining both a high degree of isolation and a high power gain. In addition, since a transmission line is nearly lossless, the power gain can be further increased when each of the first to fourth impedance matching units 13, 15, 16, 17 is implemented by a transmission line.

While the present invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A power amplifier adapted for amplifying an input signal to generate an output signal, said power amplifier comprising:
   a number (N) of power amplification modules, each of which includes an input terminal and an output terminal, where N is a positive integer greater than one;
   wherein equivalent input impedances seen respectively into said power amplification modules from said input terminals thereof are the same, and equivalent output impedances seen respectively into said power amplification modules from said output terminals thereof are the same; and
   wherein said input terminals of said power amplification modules are coupled together for receiving the input signal, said output terminals of said power amplification modules are coupled together for outputting the output signal, and each of said power amplification modules amplifies a portion of a power of the input signal to obtain a portion of a power of the output signal;
   wherein each of said power amplification modules further includes:
   a first impedance matching unit coupled to said input terminal for determining the equivalent input impedance seen into said power amplification module from said input terminal;
   a second impedance matching unit coupled to said output terminal for determining the equivalent output impedance seen into said power amplification module from said output terminal;
   an amplification unit coupled between said first and second impedance matching units for amplifying the portion of the power of the input signal to obtain the portion of the power of the output signal;
   a third impedance matching unit to couple said amplification unit to a power supply; and
   a fourth impedance matching unit to couple said amplification unit to ground;
   wherein said third and fourth impedance matching units cooperating with said first impedance matching unit to determine the equivalent input impedance seen into said power amplification module from said input terminal,
   wherein said third and fourth impedance matching units cooperating with said second impedance matching unit to determine the equivalent output impedance seen into said power amplification module from said output terminal,
   wherein said amplification unit of each of said power amplification modules includes:
   a transistor having a first terminal coupled to said second and third impedance matching units, a second terminal coupled to said fourth impedance matching unit, and a control terminal coupled to said first impedance matching unit.

2. The power amplifier of claim 1, wherein said first impedance matching unit of each of said power amplification modules includes:
   a first transmission line coupled between said input terminal of said amplification module and said control terminal of said transistor of said amplification unit.

3. The power amplifier of claim 1, wherein said second impedance matching unit of each of said power amplification modules includes:
   a second transmission line coupled between said output terminal of said amplification module and said first terminal of said transistor of said amplification unit.

4. The power amplifier of claim 1, wherein said third impedance matching unit of each of said power amplification modules includes:
   a third transmission line to couple said first terminal of said transistor of said amplification unit to the power supply.

5. The power amplifier of claim 4, wherein said third impedance matching unit of each of said power amplification modules further includes:
   a bypass capacitor to couple a common node between said third transmission line and the power supply to ground.

6. The power amplifier of claim 1, wherein said fourth impedance matching unit of each of said power amplification modules includes:
   a fourth transmission line to couple said second terminal of said transistor of said amplification unit to ground.

7. The power amplifier of claim 1, being adapted to be coupled to a signal source for receiving the input signal therefrom, wherein the equivalent input impedance seen into each of said power amplification modules from said input terminal thereof is N times an equivalent output impedance seen into the signal source.

8. The power amplifier of claim 1, being adapted to be coupled to an end terminal circuit for outputting the output signal thereto, wherein the equivalent output impedance seen into each of said power amplification modules from said output terminal thereof is N times an equivalent input impedance seen into the end terminal circuit.

* * * * *